(12) United States Patent
Huang

(10) Patent No.: US 6,741,460 B2
(45) Date of Patent: May 25, 2004

(54) STRUCTURE FOR MOUNTING CIRCUIT BOARD TO HOUSING OF DATA PROCESSING DEVICE

(75) Inventor: King-Tung Huang, Taipei Hsien (TW)

(73) Assignees: Wistron Corporation, Hsi-Chih (TW); Acer Incorporated, Hsi-Chih (TW)

( * ) Notice: Subject to any disclaimer, the term of this patent is extended or adjusted under 35 U.S.C. 154(b) by 0 days.

(21) Appl. No.: 10/063,942

(22) Filed: May 28, 2002

(65) Prior Publication Data

US 2002/0181191 A1 Dec. 5, 2002

(30) Foreign Application Priority Data

Jun. 4, 2001 (TW) .................................. 90209326 U

(51) Int. Cl.$^7$ ................................................. G06F 1/16

(52) U.S. Cl. ...................... 361/683; 361/759; 248/121

(58) Field of Search ............................ 361/728–733, 361/736, 740, 741, 752, 756–759

(56) References Cited

U.S. PATENT DOCUMENTS 5,490,038 A * 2/1996 Scholder et al. ............ 361/759
6,186,800 B1 * 2/2001 Klein et al. ................. 439/95

* cited by examiner

Primary Examiner—Darren Schuberg
Assistant Examiner—Yean Hsi Chang
(74) Attorney, Agent, or Firm—Winston Hsu

(57) ABSTRACT

A structure for mounting a circuit board to a housing of a data processing device includes a mounting post, a retaining unit, and a stopper. The mounting post secured to the circuit board has a groove formed on the outer surface thereof. The retaining unit provided on a surface of the housing has a slot for receiving the mounting post through the groove along a direction parallel to the surface of the housing. The circuit board is inserted into the housing through the cooperation of the mounting post and the retaining unit. The stopper provided on the housing of the data processing device is moveable between a first position and a second position. In the first position, the stopper stops the circuit board from moving out of the housing. In the second position, the stopper allows the circuit board to move out from the housing.

11 Claims, 6 Drawing Sheets

STRUCTURE FOR MOUNTING CIRCUIT BOARD TO HOUSING OF DATA PROCESSING DEVICE

BACKGROUND OF INVENTION

1. Field of the Invention

The present invention relates to a structure, and more particularly, to a structure for mounting a circuit board to a housing of a data processing device.

2. Description of the Prior Art

Please refer to FIG. 1. FIG. 1 is a perspective view of a prior art data processing device 10. The data processing device 10 can be a server or a computer. The data processing device 10 comprises a shell 12, a motherboard (circuit board) 14, and a housing 16. In order to mount the motherboard 14 onto the housing 16, a surface of the housing 16 has a plurality of circular posts 16a installed on it, and the motherboard 14 has a plurality of holes 14a formed corresponding to the circular posts 16a. As shown in FIG. 1, upper portions of the circular posts 16a have a diameter smaller than a diameter of lower portions of the circular posts 16a for being inserted into the holes 14a of the motherboard 14. Inner portions of the upper portions of the circular posts 16a are cut into threaded holes. Therefore, the motherboard 14 can be mounted onto the housing 16 by screwing screws 18 onto the corresponding threaded holes of the circular posts 16a.

The prior art mounting method for mounting the motherboard 14 onto the housing 16 has many defects. Users must lock the plurality of screws 18 onto the threaded holes so as to fix the motherboard 14 onto the housing 16. It is inconvenient, time consuming, and expensive. The detachment operation is also difficult. When users want to detach the motherboard 14 from the housing 16, users must first remove all the screws 18 from the threaded holes, and then vertically lift up the motherboard 14 so as to detach the holes 14a of the motherboard 14 from the circular post 16a. The lifting motion is not difficult to achieve if the data processing device 10 is a small-scale personal computer. However, if the data processing device 10 is a server or other large-scale data processing device 10, the motherboard 14 is not easily lifted since the motherboard 14 of the server is heavy. Moreover, some of the servers are installed on a rack for long times, making it difficult for users to detach the motherboard 14 from the rack directly when using the prior art assemble method. In addition, when locking the screws 18 into the threaded holes or unlocking the screw 18 from the threaded holes, it is easy to form a short circuit if a screw falls onto the motherboard 14.

Therefore, a structure for easily mounting a motherboard onto a housing and easily detaching the motherboard from the housing of a data processing device is important for users.

SUMMARY OF INVENTION

It is therefore a primary objective of the claimed invention to provide a structure for easily mounting a circuit board onto a housing and easily detaching the circuit board from the housing of a data processing device, so as to solve problems of the prior art data processing device. Users can mount the circuit board onto the housing without using screws. The claimed invention structure is simple, has a low cost, and can prevent electromagnetic interference (EMI). Users can further install other components on the circuit board at a position above fixing devices so that the space of the circuit board can be efficiently used.

The claimed invention, briefly summarized, discloses a structure for mounting a circuit board to a housing of a data processing device. The structure comprises a mounting post, a retaining unit, and a stopper. The mounting post secured to the circuit board has a groove formed on the outer surface of the mounting post. The retaining unit provided on a surface of the housing has a slot with an open end for receiving the mounting post through the groove along a direction parallel to the surface of the housing. The circuit board is inserted into the housing through the cooperation of the mounting post and the retaining unit. The stopper provided on the housing of the data processing device is moveable between a first position and a second position. When the stopper is in the first position, the stopper stops the circuit board from moving out of the housing along the direction parallel to the surface of the housing. When the stopper is in the second position, the stopper allows the circuit board to move out from the housing along the direction parallel to the surface of the housing.

It is an advantage of the claimed invention that the claimed invention structure does not need to use screws to mount the circuit board onto the housing of the data processing device. Therefore, the claimed invention can prevent a short circuit from being caused by a screw falling onto the circuit board. Users can pull out the circuit board or insert the circuit board along the direction parallel to the surface of the housing, and do not need to vertically lift up the circuit board, so the assembly is convenient and quick. Besides, the housing of the data processing device, the retaining unit, and the mounting post are made of metal. Therefore, the circuit board can electrically connect to the ground housing through the mounting post and the retaining unit in order to efficiently prevent electromagnetic interference. The circuit board further comprises a throughhole. One end of the mounting post is secured to the throughhole by using surface mounting technology (SMT). An inner portion of the mounting post is cut into a threaded hole. The threaded hole can be used to install other components onto the circuit board so that the space of the circuit board can be efficiently used.

These and other objectives of the claimed invention will no doubt become obvious to those of ordinary skill in the art after reading the following detailed description of the preferred embodiment which is illustrated in the various figures and drawings.

DETAILED DESCRIPTION

The following uses FIG. 2 to FIG. 6 to illustrate an embodiment of the present invention.

Figure 1:
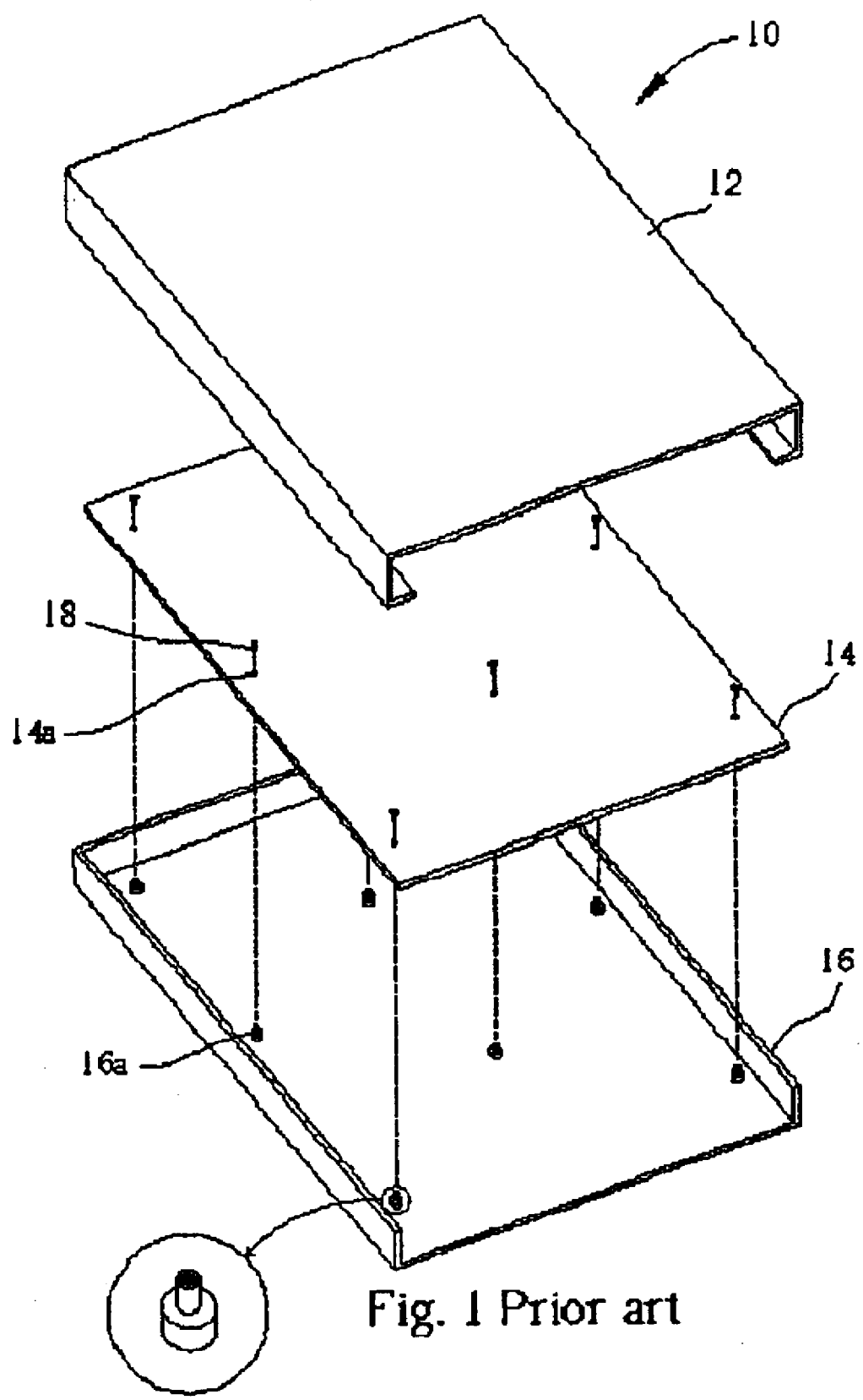
FIG. 1 is a perspective view of a prior art data processing device.
Figure 2:
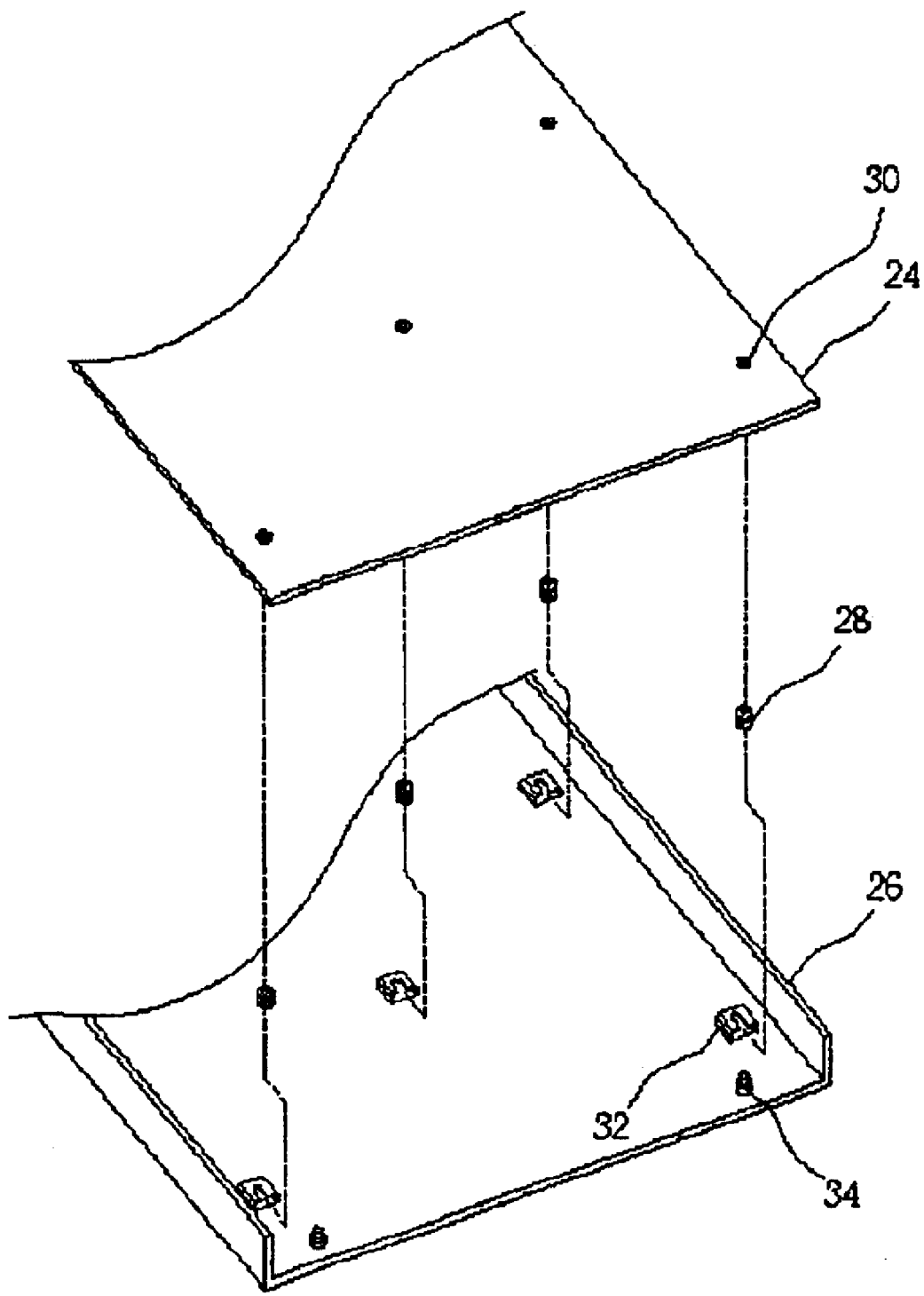
FIG. 2 is a structural diagram of a structure of the present invention data processing device.

Please refer to FIG. 2. FIG. 2 is a structural diagram of a structure of the present invention data processing device.

The structure for mounting a circuit board to a housing of a data processing device comprises a plurality of mounting posts 28, retaining units 32, and stoppers 34. The circuit board 24 has a plurality of throughholes 30 formed on it. Numbers and disposed positions of the throughholes 30 are decided by a circuit layout of the circuit board 24. The mounting posts 28 are made of metal. One end of the mounting posts 28 can pass through the throughholes 30, and the mounting posts 28 are secured to the circuit board 24 by using surface mount technology (SMT). This weld process using SMT needs short operation time, so that the assembly time and cost can be efficiently decreased. The retaining units 32 are stamped out from a bottom of the housing 26. The stoppers 34 are disposed on the bottom of the housing 26 and near an opening of the housing 26. The stoppers 26 are fixed on the housing 26 through point welding, screws, or other fixing methods.

Figure 3:
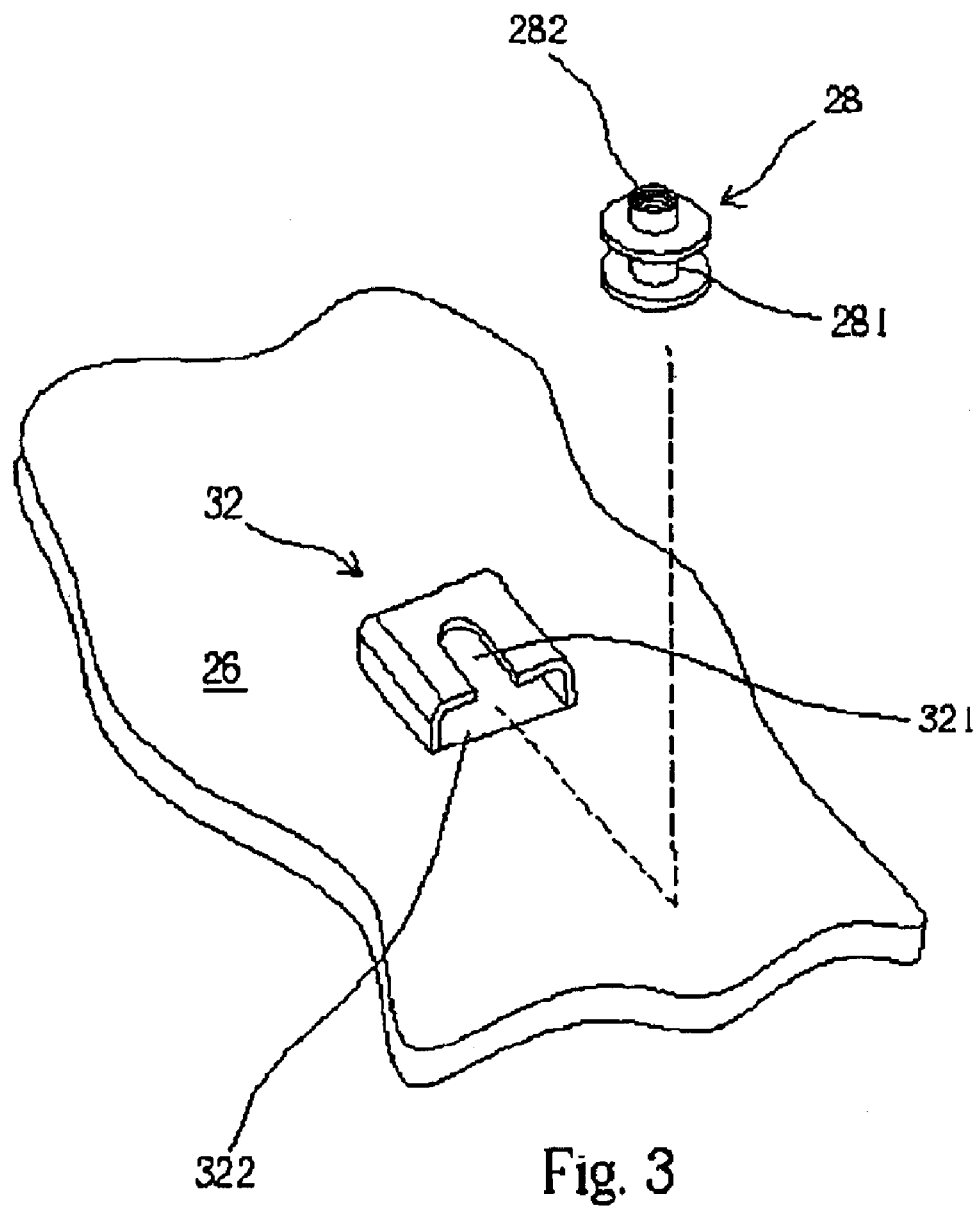
FIG. 3 is an enlarged diagram of the mounting posts and the retaining units according to the present invention.
Figure 4:
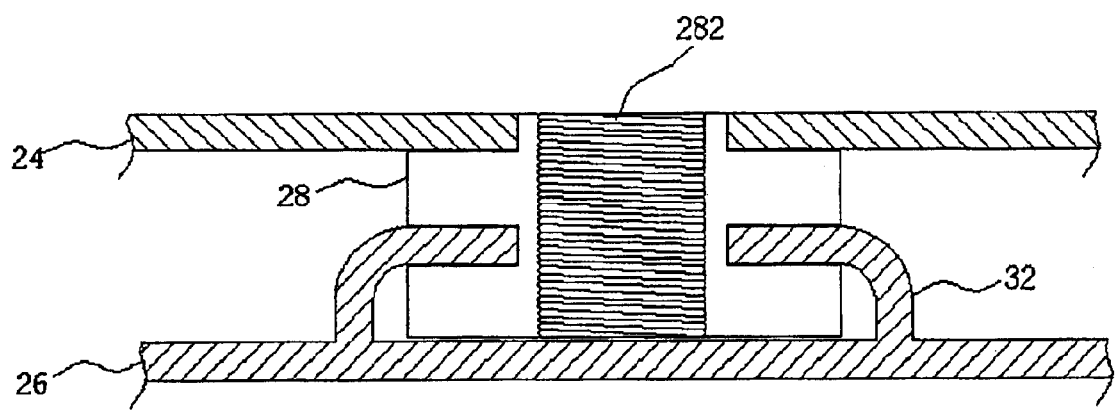
FIG. 4 is a cross-section view in which the mounting post is inserted into the retaining unit.

Please refer to FIG. 3. FIG. 3 is an enlargement diagram of the mounting post 28 and the retaining unit 32 according to the present invention. The mounting post 28 is cylinder shaped. An outer surface of the mounting post 28 has a groove 281 formed on it. An upper portion of the mounting post 28 is used to insert into the throughholes 30 of the circuit board 24, and the mounting post 28 is welded at a bottom surface of the circuit board 24. An inner portion of the mounting post 28 is cut into a threaded hole 282. The retaining unit 32 is protruded on the bottom wall of the housing 36. Each retaining unit 32 is provided with a slot 321 and an opening 322. One end of the slot 321 communicates with the opening 322. A width of the opening 322 is slightly greater than the mounting post 28, and a width of the slot 321 is nearly equal to the width of the mounting post 28 at the section of the groove 281. The mounting post 28 can thereby slide into the retaining unit 32 through the opening 322 along a direction parallel to the surface of the housing 26, and the groove 281 is engaged with the slot 321. Therefore, the circuit board 24, together with the mounting posts 28, can be inserted and fixed onto the housing 26 along the direction parallel to surface of the housing 26. Please refer to FIG. 4. FIG. 4 is a cross-section view in which the mounting post 28 is inserted into the retaining unit 32. Since the inner portion of the mounting post 28 is provided with the threaded hole 282, other components can be fixed through the threaded hole 282 on the circuit board 24 with screws. A space of the circuit board 24 can be efficiently used.

Figure 5:
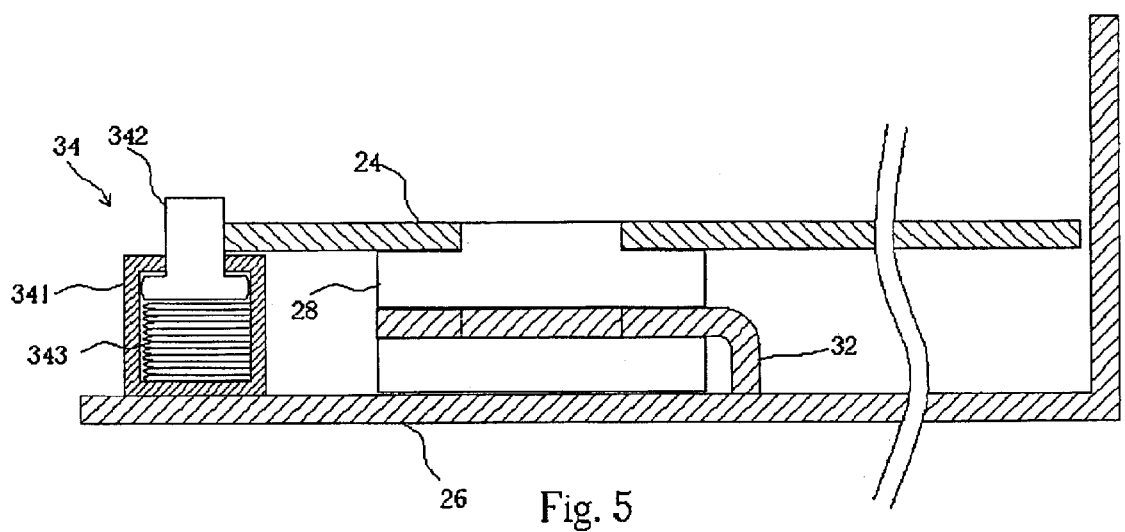
FIG. 5 is a cross-section view in which the stopper prevents the circuit board from moving out of the housing.

In order to prevent the mounting posts 32 from sliding out from the openings 322 of the retaining units 32 after the circuit board 24 has mounted onto the housing 26, the present invention structure further comprises at least a stopper 34 disposed near the opening of the housing 26 so as to prevent the circuit board 24 from moving off of the housing 26. Please refer to FIG. 5. FIG. 5 is a cross-section view in which the stopper 34 prevents the circuit board 24 from moving out of the housing 26. The stopper 34 comprises a case 341, a spring 343 disposed inside the case 341, and a moveable rod 342. A lower portion of the moveable rod 342 has a diameter greater than a diameter of an upper portion of the moveable rod 342. The lower portion of the moveable rod 342 is disposed inside the case 341 and connected with the spring 343. Before pressing the moveable rod 341, the moveable rod 341 is posited in a first position with a higher level so as to stop the circuit board 24 from moving out of the housing 26. When pressing the moveable rod 341, the moveable rod 341 is moved to a second position with a lower level so that the moveable rod 341 no longer stops the circuit board 24, and the circuit board 24 is free to be inserted into the housing 26 or to be pulled out from the housing 26 along the horizontal direction.

Figure 6:
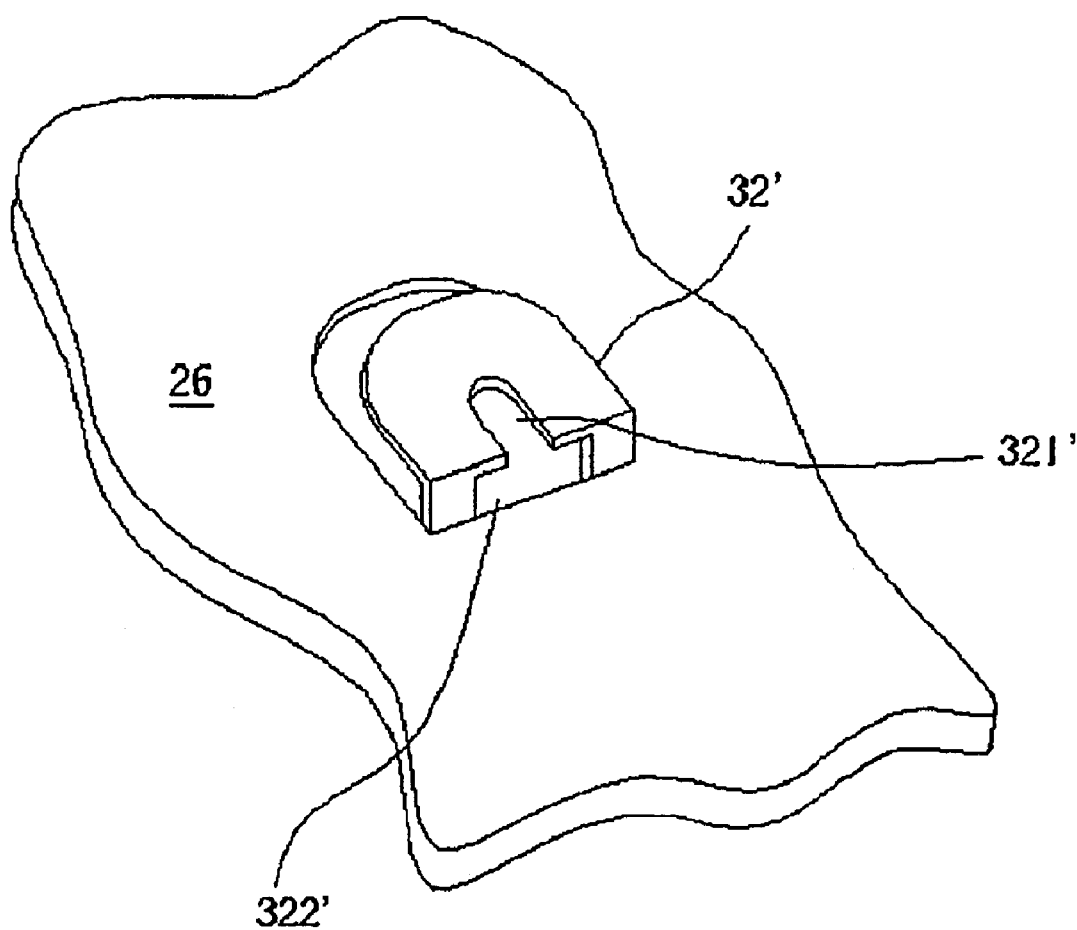
FIG. 6 is a perspective view of a retaining unit according to a second embodiment of the present invention structure.

Please refer to FIG. 6. FIG. 6 is a perspective view of a retaining unit 322″ according to a second embodiment of the present invention structure. The retaining unit 322″ of the second embodiment is also stamped out from the housing 26. The structure of the retaining unit 322″ is similar with the retaining unit 322 shown in FIG. 3. The retaining unit 322″ also has a slot 321″ and an opening 322″.

In contrast to the prior art, the present invention simplifies the structure for mounting the circuit board 24 to the housing 26 of the data processing device. Therefore, the circuit board 24 can be inserted into the housing 26 or pulled out from the housing 26 more easily and quickly. Besides, since the housing 26, the retaining unit 32, and the mounting post 28 are made of metal, so the circuit board 24 can electrically connect to the ground housing 26 through the mounting post 28 and the retaining unit 32, efficiently preventing the electromagnetic interference.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A structure for mounting a circuit board to a housing of a data processing device, comprising:

a mounting post permanently secured to the circuit board and having a groove formed on the outer surface thereof; and a retaining unit integrally formed with the housing and provided on a surface of the housing, the retaining unit having a slot with an open end for receiving the mounting post through the groove along a direction parallel to the surface of the housing;

whereby the circuit board is inserted into the housing through the cooperation of the mounting post and the retaining unit.

2. The structure of claim 1, further comprising a stopper provided on the housing of the data processing device for stopping the circuit board from moving out of the housing along the direction parallel to the surface of the housing when the mounting post is received in the retaining unit.

3. The structure of claim 2, wherein the stopper comprises a moveable rod and a spring, the moveable rod being moveable between a first position and a second position through the elasticity of the spring; when the moveable rod is in the first position, the moveable rod stops the circuit board to prevent the mounting post being released from the retaining unit; and when the moveable rod is in the second position, the moveable rod does not stop the circuit board so that the mounting post is free to be released from the retaining unit.

4. The structure of claim 1, wherein the housing of the data processing device, the retaining unit and the mounting post are made of metal.

5. The structure of claim 4, wherein the retaining unit is stamped out from the housing.

6. The structure of claim 1, wherein the circuit board has a throughhole for receiving one end of the mounting post and the mounting post is secured to the circuit board at the throughhole.

7. The structure of claim 6, wherein an inner portion of the mounting post is cut into a threaded hole communicating with the throughhole in the circuit board.

8. A structure for mounting a circuit board to a metal housing of a data processing device, comprising:
- a metal mounting post permanently secured the circuit board and having a groove formed on the outer surface thereof;
- a metal retaining unit stamped out from the housing and provided on a surface of the housing, the retaining unit having a slot with an open end for receiving the mounting post through the groove along a direction parallel to the surface of the housing; whereby the circuit board is inserted into the housing through the cooperation of the mounting post and the retaining unit; and
- a stopper provided on the housing of the data processing device moveable between a first position and a second position; wherein when the stopper is in the first position, the stopper stops the circuit board from moving out of the housing along the direction parallel to the surface of the housing; and when the stopper is in the second position, the stopper allows the circuit board to move out of the housing along the direction parallel to the surface of the housing.

9. The structure of claim 8, wherein the circuit board has a throughhole for receiving one end of the mounting post and the mounting post is secured to the circuit board at the throughhole.

10. The structure of claim 9, wherein an inner portion of the mounting post is cut into a threaded hole communicating with the throughhole in the circuit board.

11. A structure for mounting a circuit board to a housing of a data processing device, comprising:
- a metal mounting post permanently secured to the circuit board and having a groove formed on the outer surface thereof; and
- a metal retaining unit stamped out from the housing and provided on a surface of the housing, the retaining unit having a slot with an open end for receiving the mounting post through the groove along a direction parallel to the surface of the housing;
- whereby the circuit board is inserted into the housing through the cooperation of the mounting post and the retaining unit.

* * * * *